United States Patent
Wang et al.

(10) Patent No.: US 9,110,386 B2
(45) Date of Patent: Aug. 18, 2015

(54) FOCUS CONTROL APPARATUS FOR PHOTOLITHOGRAPHY

(71) Applicant: Taiwan Semiconductor Manufacturing Co., Ltd., Hsin-Chu (TW)

(72) Inventors: Jen-Pan Wang, Tainan (TW); Chien-Hsuan Liu, Tainan (TW); Ching-Hsien Chen, Kausiung (TW); Chao-Chi Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/300,499

(22) Filed: Jun. 10, 2014

(65) Prior Publication Data

US 2014/0293250 A1    Oct. 2, 2014

Related U.S. Application Data

(62) Division of application No. 13/227,805, filed on Sep. 8, 2011, now Pat. No. 8,772,054.

(51) Int. Cl.
*G03F 7/20* (2006.01)
*G03F 9/00* (2006.01)

(52) U.S. Cl.
CPC ........ *G03F 7/70641* (2013.01); *G03F 7/70341* (2013.01); *G03F 9/7026* (2013.01); *G03F 9/7034* (2013.01); *G03F 9/7053* (2013.01)

(58) Field of Classification Search
CPC .............................................. H01L 21/67253
See application file for complete search history.

(56) References Cited

U.S. PATENT DOCUMENTS

| | | | |
|---|---|---|---|
| 5,240,552 A | * | 8/1993 | Yu et al. ............................ 438/5 |
| 5,439,551 A | | 8/1995 | Meikle et al. |
| 6,684,704 B1 | | 2/2004 | Obeng |
| 6,730,603 B2 | | 5/2004 | Crevasse et al. |
| 2006/0221322 A1 | | 10/2006 | Tinnemans et al. |
| 2012/0309116 A1 | | 12/2012 | Colgan et al. |

OTHER PUBLICATIONS

Rudolph Wins Multiple System Orders for Its Latest MetaPULSE-G Metrology System, 2011, found at http://www.thestreet.com/story/10998002/rudolph-wins-multiple-system-orders-for-its-late . . . 7 pages.
Rudolph Technologies, "Opaque Film Metrology", 2011, found at http:www.rudolphtech.com/TechnologyOverview/TechnologyOpaqueFilms.aspx, 1 page.
Rudolph Technologies, "MetaPULSE III", 2011, found at http://www.rudolphtech.com/MetrologyProduct_ProductMetaPULSEIII.aspx, 1 page.

(Continued)

*Primary Examiner* — Angel Roman
(74) *Attorney, Agent, or Firm* — Duane Morris LLP; Steven E. Koffs (57) ABSTRACT

A method comprises providing a semiconductor substrate having at least one layer of a material over the substrate. A sound is applied to the substrate, such that a sound wave is reflected by a top surface of the layer of material The sound wave is detected using a sensor. A topography of the top surface is determined based on the detected sound wave. The determined topography is used to control an immersion lithography process.

20 Claims, 6 Drawing Sheets

(56) References Cited

OTHER PUBLICATIONS

Rudolph Technologies, "MetaPULSE-G System", 2011, found at http:www.rudolphtech.com/MetrologyProduct_ProductMetaPULSEG.aspx, 1 page.

Merriam, A.J. et al., "A Solid-state 193 nm Laser with HIgh Spatial Coherence for sub-40 nm Interferometric Immersion Lithography", Proc. SPIE 6520, 65202Z, Feb. 2007, 7 pages.

"Immersion Lithography", from Wikipedia, 2011, found at http://en.wikipedia.org/wiki/Immersion_lithography, 3 pages.

Serry, F.M. et al., Minimizing Dishing and Erosion in Copper CMP: In-Line Monitoring with the Dimension™ Vx Atomic Force Profiler, VEECO, 2 pages.

* cited by examiner

FOCUS CONTROL APPARATUS FOR PHOTOLITHOGRAPHY

This application is a division of U.S. patent application Ser. No. 13/227,805, filed Sep. 8, 2011, which is incorporated by reference herein in its entirety.

FIELD

This disclosure relates to semiconductor fabrication tools and methods of using the tools.

BACKGROUND

In semiconductor fabrication using single and dual damascene methods, a series of interconnect layers are formed by depositing an inter-metal dielectric (IMD) material, forming a trench in the IMD layer, overfilling the trench with copper (to form a conductive trace), and planarizing the substrate. Chemical mechanical polishing (CMP) is commonly used for planarization, to remove all the copper above the surface of the IMD layer.

Uneven topography can reduce yield and affect device performance. The CMP process is intended to achieve a flat topography to improve yield. Nevertheless, during CMP, copper and the adjacent IMD material are removed from the wafer at different rates, creating non-uniform topography. Line density is known to affect the removal rates of the IMD and copper materials. Generally, the topography impact is greater in a dense pattern region than in a low density ("iso") region. Dishing and erosion are the two most costly topography issues that arise with copper CMP. Dishing occurs when the copper recedes below or protrudes above the level of the adjacent dielectric. Dishing is often observed as a concavity extending across several lines. Erosion is a localized thinning of the dielectric between two adjacent lines.

If the CMP process leaves an uneven topography, then subsequent processing of the substrate may be affected adversely.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1:
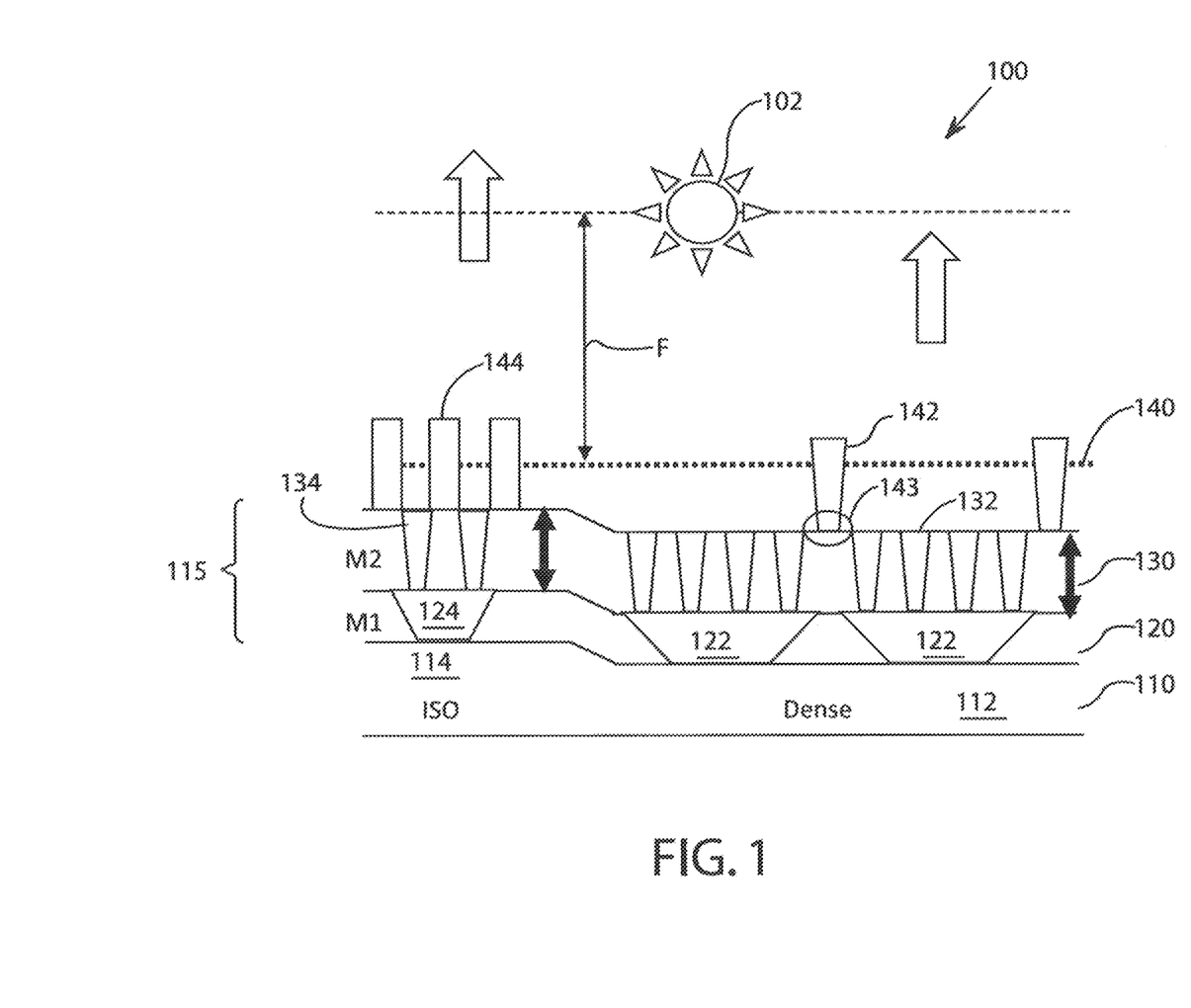
FIG. 1 is a diagram showing a focus problem in the presence of copper dishing.

FIG. 1 is a diagram of a focus problem raised by the presence of copper dishing, erosion, and other wafer surface topography abnormalities.

A lithography tool 100 is shown, for selectively exposing a photoresist material. Details of the apparatus are omitted for clarity. A light source 102 provides collimated light for exposing the photoresist. The light source may be, for example, a solid state 193 nm YAG laser, other ultraviolet laser, or other laser suitable for immersion lithography.

A substrate 100 may be a wafer on which multiple integrated circuits (IC) are to be formed. The substrate 110 can be, for example, a silicon substrate, a III-V compound substrate, a glass substrate, or any other substrate suitable for IC fabrication. The substrate has a plurality of active devices (not shown), above which an interconnect structure 115 is formed.

The interconnect structure includes a plurality of inter-metal dielectric (IMD) layers 120, 130. Although only two layers 120, 130 are shown, the substrate 110 may have any number of IMD layers. For example, configurations of eight to 15 IMD layers are common. The dielectric layers can be formed of a material such as, an undoped silicate glass (USG), a boron doped silicate glass (BSG), a phosphorous doped silicate glass (PSG), a boron phosphorous doped silicate glass (BPSG), a silicon nitride, a silicon oxy-nitride, a fluorine doped silicate glass (FSG), a low-k dielectric, and extreme low-K (ELK) or a combination thereof.

The dielectric layers 120, 130 have a plurality of conductive patterns 122, 124 132, 134 and vias (not shown), which may be copper lines and vias formed by a single or dual damascene process. The substrate may have any number of dense regions 112, in which a large fraction of the local substrate area is occupied by the conductive material, and ISO regions 114, in which a large fraction of the local substrate area is dielectric material, not occupied by the conductive material.

The substrate 110 may have varying topography due in part to the dishing and erosion. As used herein, the term "topography" refers to the local features and height variations of the surface of the wafer, both within and between fields, where each IC die on the substrate may have one or more fields patterned on it by the photolithography process. Thus, the topography of the substrate 110 includes (intra-field) variations within an individual field, which are not considered in determining the uniformity of the wafer thickness (i.e., the measure of inter-field thickness variation). For example, in FIG. 5, a wafer 110 has a plurality of IC's 600, each patterned by exposing a field. The uniformity measures inter-field variations between the ICs 600. In FIG. 6, the topography of an individual die is represented by various tones (shades of gray). The thickness of the substrate varies within the individual die, for example at various points 601-609.

Referring again to FIG. 1, the focal length F of the lens 102 is set such that the light 144 reaching the plane 140 above the ISO regions 114 of the substrate 110 is focused, but the light 142 reaching the same plane above the dense regions 112 is out of focus. In particular, the surface of portion 143 of the substrate 110 receives out-of-focus light. As a result, the varying topography can result in varying sharpness when a photoresist over the substrate is patterned.

The inventors have determined that the focusing problem can be addressed by measuring the topography of the photoresist layer (leveling) after the CMP step, and feeding the topography information forward to the photolithography system, for within-field correction of the focus and/or energy level of the laser. The focus and energy can be adjusted separately for each of multiple locations within the same field.

In a photolithography system having an air medium between the lens and the substrate, an optical system may be used to measure the topography. However, when a light is directed at the surface of the photoresist layer, a portion of the light may be transmitted through the photoresist and reflected by the underlying layer, causing interference with the light that is reflected directly from the top surface of the photoresist. Also, if an immersion lithography system is used, a liquid medium is provided between the lens and substrate. The liquid medium may be, for example, ultra pure water (UPW) or other immersion medium that has a suitable refractive index and does not react with the substrate materials. Thus, a method of measuring the topography is used, which is suitable for measurement while the surface of the substrate is under a liquid medium.

Figure 2:
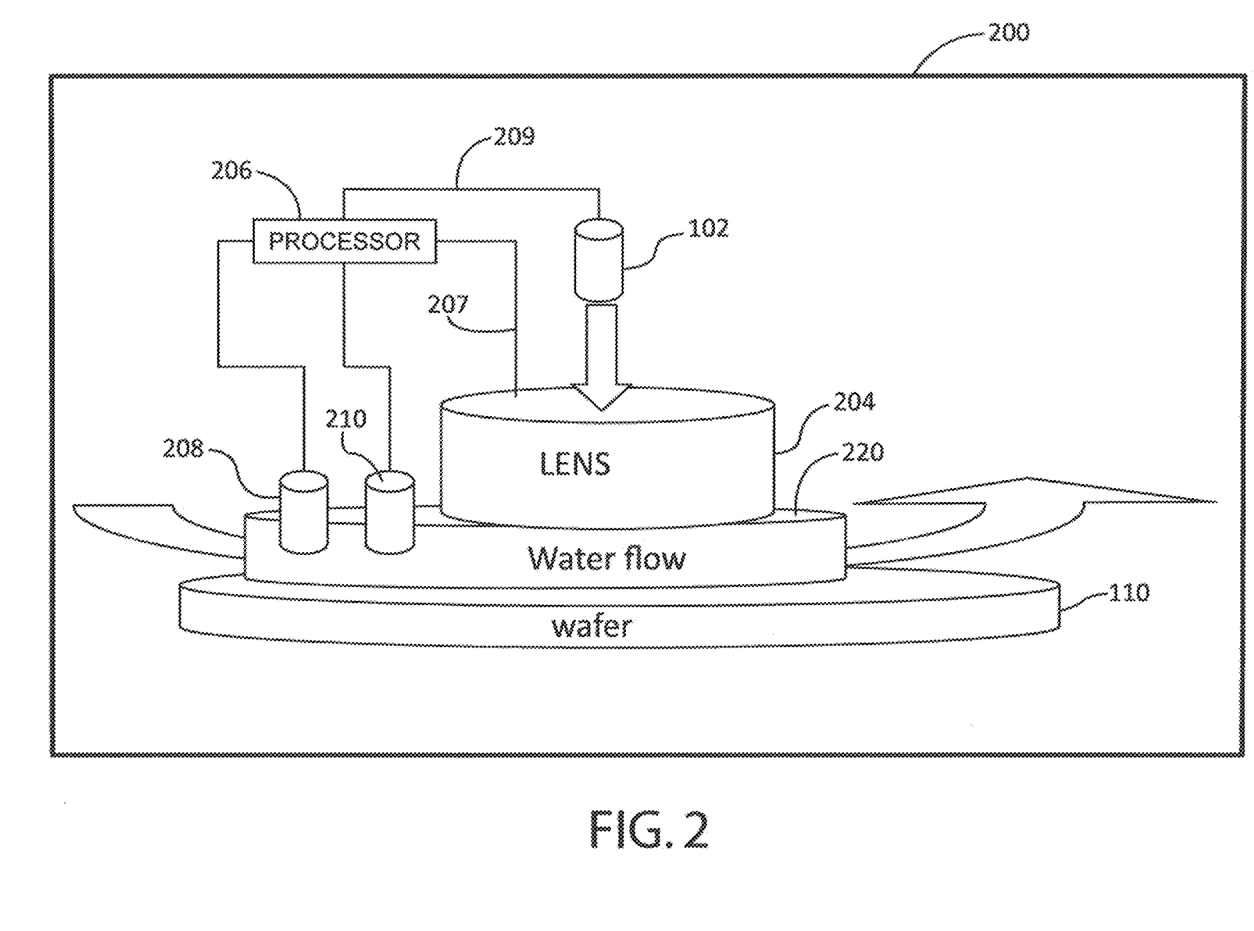
FIG. 2 is a schematic diagram of an immersion lithography apparatus using SONAR topography measurement to control lens focus.
Figure 3:
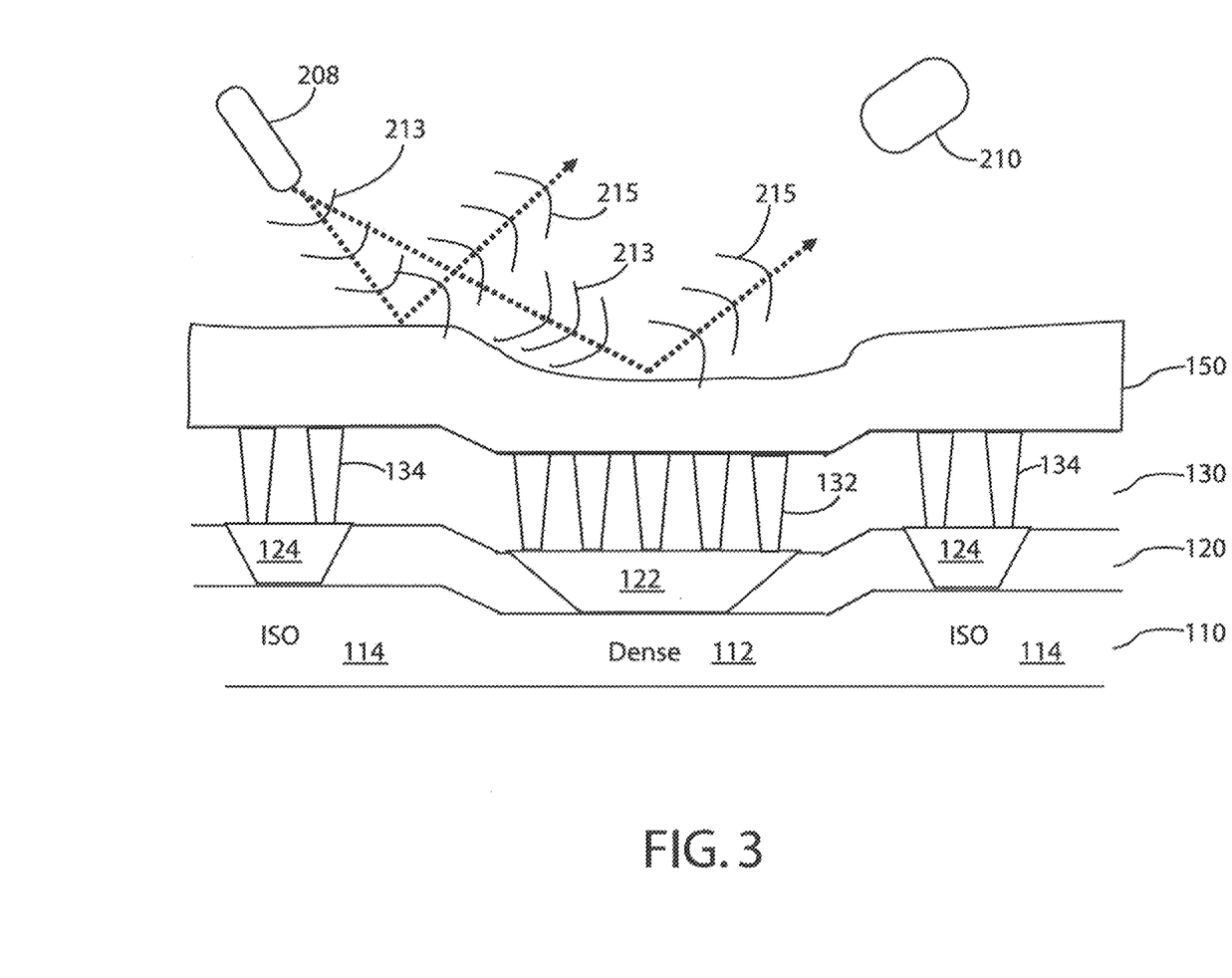
FIG. 3 is a diagram showing the use of the SONAR system of FIG. 2.

FIGS. 2 and 3 show an immersion photolithography tool having a chamber 200 configured for selectively exposing a portion of a photoresist layer 150 above a substrate 110. The tool has a light source 102 for exposing a field of the photoresist layer 150.

A sound source 208 is positioned to emit a sound 213 into the chamber 200, such that the sound is reflected from a top surface of the photoresist layer 150.

A sound detector 210 is positioned to receive the reflected sound 215. The sound source 208 and sound detector 210 are both positioned for operating within the chamber 200 for in situ measurement of the local thickness within the same chamber in which the photoresist 150 is exposed. Thus, the substrate 110 can be moved within the chamber 200 directly from the leveling station to the immersion lithography station. Because the substrate 110 is not removed from its carrier before proceeding to the immersion lithography tool, the substrate is still well registered with its carrier when it reaches the lithography station.

The sound source 208 and sound detector 210 may both be piezoelectric transducers. A piezoelectric transducer is capable of converting an electric voltage applied to it into a mechanical strain resulting in a sound wave. A piezoelectric transducer is also capable of converting a sound wave (strain) into an electrical voltage (or electric charge). As an example, transducer 208 may include a piezoelectric thin film that acts as a driver. When a voltage pulse is applied to the transducer 208, the voltage is converted by the piezoelectric thin film into the sound wave 213. The sound detector 210 can similarly include a piezoelectric thin film that acts as a detector for converting the reflected sound wave 215 back into a voltage. Suitable piezoelectric thin films include, but are not limited to, polyvinylidene difluoride ($PVF_2$) and tetrafluoroethylene.

A processor 206 includes a module for generating, receiving, and analyzing the sound waves. Processor 206 may include one or more programmed processors, and may also include one or more application specific circuits (not shown). In one embodiment, for generating the sound waves 213 a pulse generator (not shown) directs a signal through a signal amplifier (not shown) to the transducer 208.

In a similar manner the sound detector 210 may have a piezoelectric film for detecting the reflected sound waves from the photoresist and converting the reflected sound waves to a voltage. The piezoelectric film of the detector 210 is provided to a low noise amplifier (not shown). A lock-in amplifier (not shown) coordinates the signals generated by the pulse generator (not shown) and received by the receiver. Processor 206 analyzes the different signals and can use this information to develop the topology map.

In other embodiments, the sound detector 210 may be of the same type used in the Meta-Pulse II or Meta-Pulse III Metrology Tool, sold by the Rudolph Technologies, Inc. of Flanders, N.J. However, as shown in present FIGS. 2-3, the sound detector 210 is incorporated into the chamber 200 of the immersion photolithography apparatus for in-situ topography measurement.

The processor 206 is configured to calculate a local thickness of the photoresist layer 150 at a plurality of locations 601-609 within the field with sufficient precision to determine a local topography within the field, the calculation based on a round trip time of the sound. The processor 206 commands the sound source 208 to generate the sound and receives signals representing the received sound level from the detector 210. The processor compares the time stamp of the sound emission to the stamp of the detection of the sound by the sound detector 210, and analyzes the sound data to determine the local distance to the top surface of the photoresist 150 at a plurality of locations within each field 601-609 (i.e., determine the topography). Although nine locations 601-609 are indicated within the field, the thickness may be measured at any desired number of locations. The number of measured locations in each field may be defined by considering the cycle time and desired degree of accuracy. The more locations used, the more accurate the result will be, but an increased number of focus and energy adjustments will result in a longer process time. The numbers of fields and dies are different in different productions, so the process time accounts for these factors.

The sound waves 213 are directed at the photoresist layer 150 on the front side of the wafer 110. The receiver 210 detects the arrival of reflected sound waves 215 from the wafer 110. By analyzing the transmitted sound waves 213 and reflected sound waves 215, the local distance from the transducers 208, 210 to the photoresist 150 can be determined at a plurality of locations 601-609 within each field.

In general, the distance between the transducer 208 and the photoresist 150 can be determined from the total time (T1−T2), (i.e. the time interval between the transmission of an sound wave 213 by the transducer 208 and the reception of the reflected wave 215 by the receiver 210) and by the speed of the sound waves through the medium (e.g., UPW). The calculation is simplified if the transducer 208 and receiver 210 are both at the same height, but this is not a requirement, and one of ordinary skill can readily adapt the calculation for equipment in which the transducer 208 and receiver are at different heights. The relationship can be expressed by the formula $x=V(T1-T2)/2$. In this equation, V equals the velocity of the sound waves 213, 215 in the medium (e.g., speed of sound in water). The total travel time of the sound waves 213, 215 in turn is given by T1−T2, where T1 is the launch time by the transducer 208 and T2 is the reception time by the receiver 210.

Figure 5:
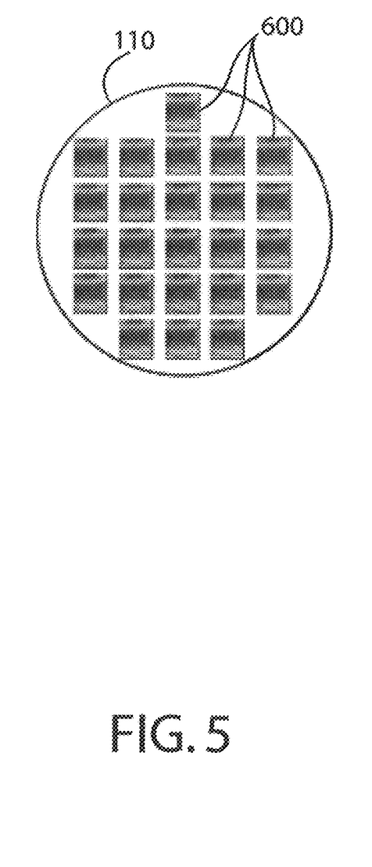
FIGS. 5 and 6 show a wafer having a plurality of integrated circuit dies, each having at least one field with individual thickness measurements.
Figure 6:
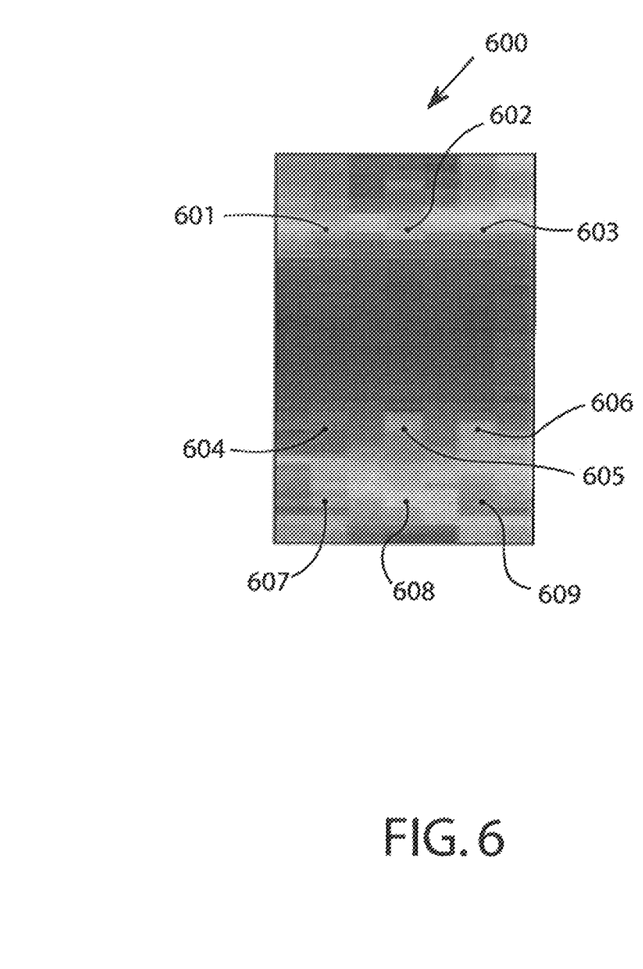

As shown in FIGS. 3, 5 and 6, sound waves 213 are generated by the transducer 208 continuously during leveling, at various locations 601-609 within each field 600. These incident sound waves 213 are of a known frequency, duration and amplitude. The reflected sound waves 215 are detected by the receiver 210 after the round trip time period T1−T2. The frequency, duration and amplitude of the reflected waves 215 can also be analyzed and compared to established data. Thus, the topography within each field 600 is determined by the processor 206.

Processor 206 determines a respective best focal length for lens 204 corresponding to each respective location 601-609 within the field. Since the relative distance between the lens and the transducer 208 is known, the focal length can be determined by adding the lens-transducer distance to the measured distances collected during leveling.

In some embodiments, the transducer 208 generates and transmits ultrasonic sound waves, to reduce the ambient sound level of the equipment. In some embodiments, the transducer 208 may be configured to generate sound waves at multiple frequencies, in turn. By performing several signal intensity measurements using the various frequencies, the system may provide even further accuracy in the detection of the topography.

Processor 206 also determines a respective energy level for laser 102 corresponding to each respective location 601-609 within the field. The energy levels are determined based on the focal length and empirical data.

The photolithography tool has a lens 204 for focusing light on the field 600 of the substrate 110. The processor 206 is configured to generate a focus parameter for focusing the lens 204, based on the determined topography, and to provide a signal 207 for controlling the lens based on the focus parameter.

The processor 206 is also configured to generate an energy level parameter for the light source 102, based on the determined topography, and to provide a signal 209 for controlling an energy level of the light source based on the energy level parameter.

The tool further comprises a water supply (FIG. 4) for supplying water 220 between the lens 204 and the substrate 110.

Figure 4:
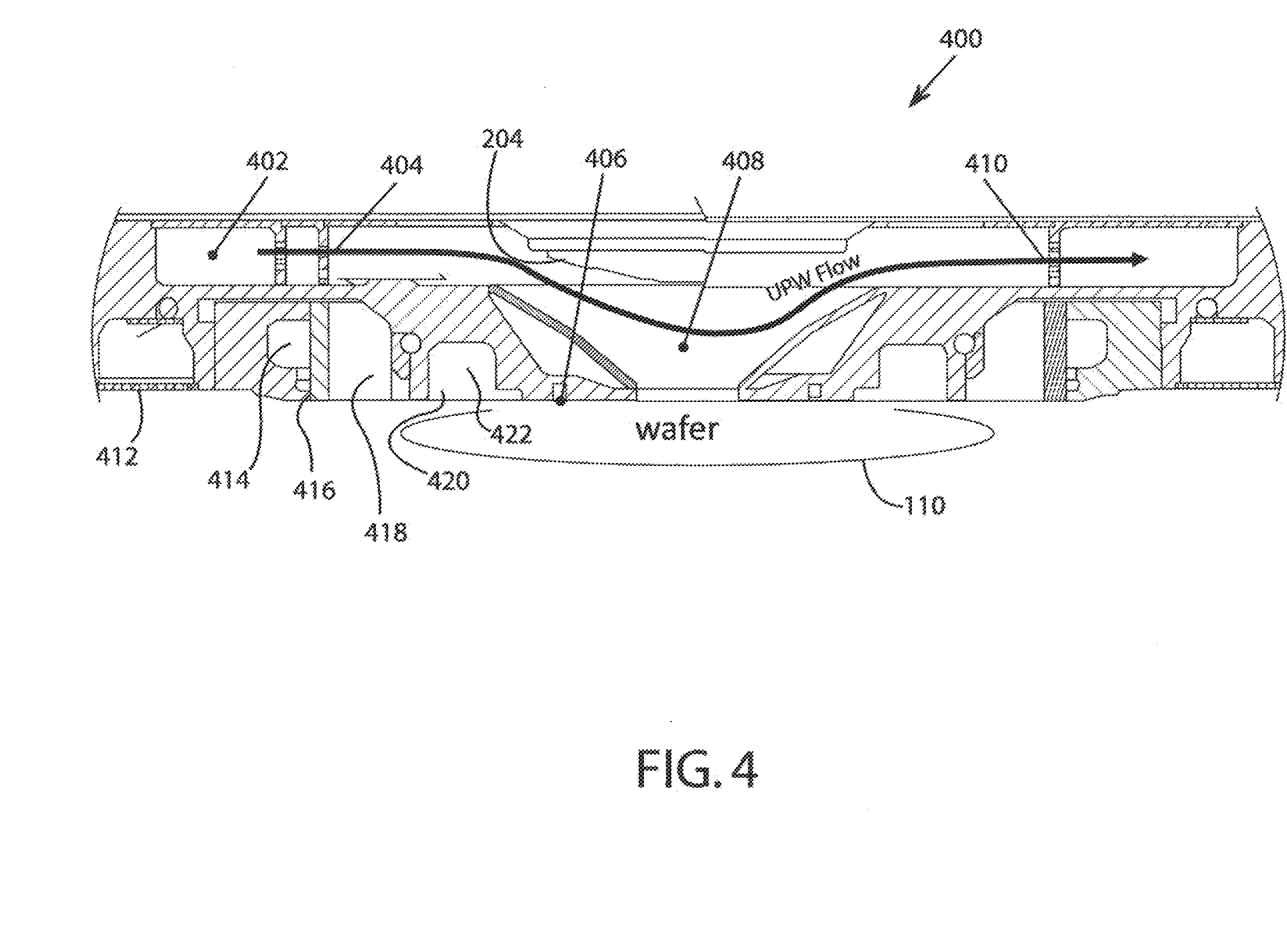
FIG. 4 is a diagram showing details of the immersion lithography apparatus.

FIG. 4 shows additional details of one embodiment of an immersion lithography tool 400. The tool 400 has an ultra pure water (UPW) source 402, a lens water supply (LWS) 404, a gap water supply 406, a lens water area 408 between the lens 102 and the substrate 110, a water surface extraction (WSE) region 410, an external air knife extraction 412, a source 414 of extreme clean humidified air, an air knife 416, an air knife extraction 418, a micro sieve 420, and a single phase extraction region 422. This is only an example, and immersion lithography tools with other configurations may be used.

Figure 7:
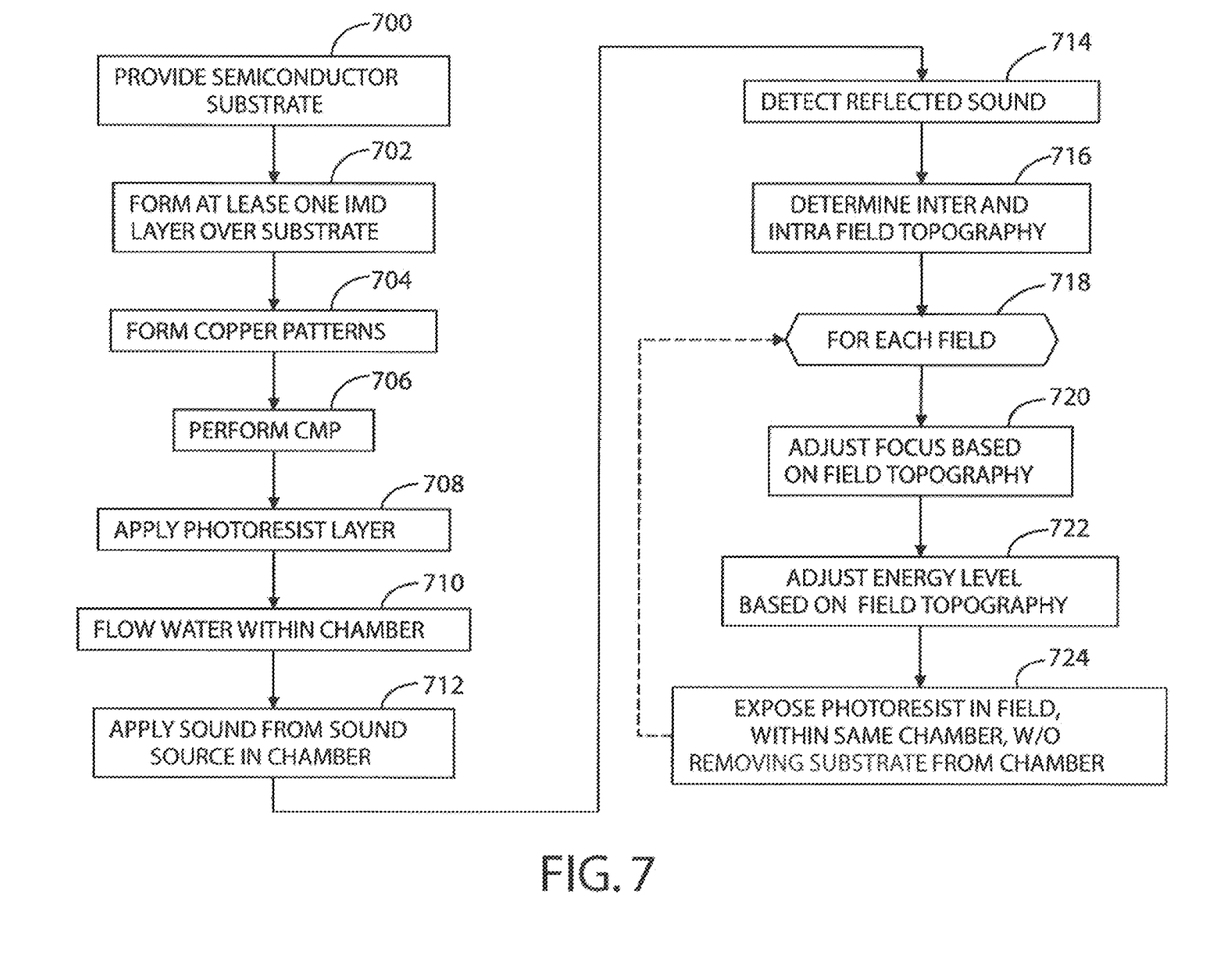
FIG. 7 is a flow chart of a method for topography measurement and equipment control.

FIG. 7 is a flow chart of one example of a method for using the SONAR related photoresist thickness information to control a photolithography process. Although the example of FIG. 7 describes the use of the method for measuring topography of a photoresist over a back end of line (BEOL) IMD layer, the method is not limited to BEOL layers. For example Copper CMP can create non-uniform topography; and IMD CMP and tungsten CMP can also induce dishing and erosion because of POLY distribution on the device. The SONAR method described herein may also be applied to measure the topography of any of these layers. Advantageously, the user of these SONAR techniques is not limited by optical properties of the material for which the topography is measured.

At step 700, a semiconductor substrate 110 is provided, and the front end of line (FEOL) processing is performed. This includes formation of the active device layers.

At step 702, after completion of the front end of line (FEOL) processing, an IMD layer 130 is formed over the substrate 110.

At step 704, the IMD layer 130 is patterned to form trenches. Then the trenches are filled with conductive material (e.g., copper).

At step 706, CMP is performed to planarize the substrate.

At step 708, a photoresist layer 150 is applied over the planarized IMD layer 130.

At step 710, the substrate 110 has been placed in the immersion photolithography tool, and the immersion medium (e.g., UPW) 220 is flowed through the chamber, fully filling the space between the lens 204 and the photoresist 150.

Steps 712 to 716 are performed in situ, without removing the substrate 110 from the chamber of the immersion lithography tool. At step 712, a sound 213 is applied to the substrate 110, such that a sound wave 215 is reflected by a top surface of the layer 150 of material.

At step 714, the sound wave 215 is detected using a sensor 210.

At step 716, a topography of the top surface is determined based on the detected sound wave. The determining step is performed in situ in the immersion photolithography tool. The topography is determined with sufficient precision to measure intra-field variations in surface height. The determined topography can then be used to control an immersion lithography process.

At step 718, a loop including steps 720-724 is performed for each field. This loop may optionally be repeated plural times for each die. For example, a die may be patterned with two or more fields in plural exposures, and the loop of steps 720-724 may be repeated to adjust the focus and energy level separately for each respectively field in the die.

At step 720, the focus of the immersion photolithography tool is adjusted based on the determined topography. The focus is adjusted to be within a window where both photoresist tapering and photoresist scum are avoided. The adjusting step is performed individually for scanning each respective field of the substrate, At step 722, before exposing the photoresist, the energy level of a beam of the immersion photolithography tool is adjusted based on the determined topography. The energy is adjusted so that the after develop inspection critical dimension of the patterned lines will be within the acceptable range (between minimum and maximum widths). The energy level of the beam may be adjusted individually for exposing each respective field of the substrate.

At step 724, the photoresist is exposed after adjusting the focus.

In some embodiments, a method comprises: (a) providing a semiconductor substrate having at least one layer of a material over the substrate; (b) applying sound to the substrate, such that a sound wave is reflected by a top surface of the layer of material; (c) detecting the sound wave using a sensor; (d) determining a topography of the top surface based on the detected sound wave; and (e) using the determined topography to control an immersion lithography process.

In some embodiments, a method comprises: (a) providing a semiconductor substrate having an inter-metal dielectric layer with a plurality of metal patterns, and a layer of photoresist over the inter-metal dielectric layer; (b) applying sound to the substrate, such that a sound wave is reflected by a top surface of the layer of photoresist; (c) using a sensor to detect the sound wave; (d) determining a topography of the top surface based on the detected sound wave, with sufficient precision to measure intra-field variations in surface height; (e) adjusting a focus of a photolithography tool and an energy level of a beam of the photolithography tool, based on the determined topography; and (f) exposing the photoresist after adjusting the focus and energy level.

In some embodiments, an apparatus comprises an immersion photolithography tool having a chamber configured for selectively exposing a portion of a photoresist layer above a substrate. The tool has a light source for exposing a field of the photoresist layer. A sound source is positioned to emit a sound into the chamber, such that the sound is reflected from a top surface of the photoresist layer. A sound detector is positioned to receive the reflected sound. A processor is configured to calculate a local thickness of the photoresist layer at a plurality of locations within the field with sufficient precision to determine a local topography within the field, the calculation based on a round trip time of the sound.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, when the computer program code is loaded into and executed by a computer, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

The invention claimed is:

1. Apparatus, comprising:
a sound source positioned to emit a sound into a photolithography chamber, such that the sound is reflected from a top surface of a photoresist layer over a semiconductor substrate therein;
a sound detector positioned to receive the reflected sound; and
a processor configured to calculate a local thickness of the photoresist layer and determine a topography of the photoresist layer, based on an amount of time between when the sound is emitted and when the sound is received by the sound detector.

2. The apparatus of claim 1, further comprising a lens, wherein the processor is configured to generate a focus parameter for focusing the lens, based on the determined topography, and to provide a signal for controlling the lens based on the focus parameter.

3. The apparatus of claim 2, wherein the processor is configured to generate the focus parameter corresponding to each respective field of the substrate, and to provide a respective signal for controlling the lens for each respective field based on the focus parameter generated for that respective field.

4. The apparatus of claim 1, further comprising a light source, wherein the processor is configured to generate an energy level parameter for the light source, based on the determined topography, and to provide a signal for controlling an energy level of the light source based on the energy level parameter.

5. The apparatus of claim 4, wherein the processor is configured to generate the energy level parameter corresponding to each respective field of the substrate, and to provide a respective signal for controlling the energy level for each respective field based on the energy level parameter generated for that respective field.

6. The apparatus of claim 4, wherein the light source is a YAG laser.

7. The apparatus of claim 1, wherein the tool further comprises:
a lens for focusing light on the photoresist; and
a water supply for supplying water between the lens and the substrate.

8. The apparatus of claim 1, wherein the sound source and sound detector are both positioned for operating within the photolithography chamber for in situ measurement of the local thickness within the same photolithography chamber in which the photoresist is exposed.

9. The apparatus of claim 1, wherein at least one of the group consisting of the sound source and the sound detector comprises a piezoelectric transducer.

10. The apparatus of claim 1, wherein the sound source is a piezoelectric transducer, and the apparatus further comprises a pulse generator for providing a signal through a signal amplifier to the piezoelectric transducer.

11. The apparatus of claim 10, wherein the transducer is configured to generate sound waves at multiple frequencies, in turn.

12. Apparatus comprising:
an immersion photolithography tool having a chamber configured for selectively exposing a photoresist layer above a substrate;
a sound source positioned to emit a sound into the chamber, such that the sound is reflected from a top surface of the photoresist layer;
a sound detector positioned to receive the reflected sound; and
a processor configured to calculate a local thickness of the photoresist layer and determine a topography of the photoresist layer, based on an amount of time between when the sound is emitted and when the sound is received by the sound detector.

13. The apparatus of claim 12, further comprising a lens, wherein the processor is configured to generate a focus parameter for focusing the lens, based on the determined topography, and to provide a signal for controlling the lens based on the focus parameter.

14. The apparatus of claim 12, further comprising a light source, wherein the processor is configured to generate an energy level parameter for the light source, based on the determined topography, and to provide a signal for controlling an energy level of the light source based on the energy level parameter.

15. The apparatus of claim 14, wherein the light source is a YAG laser.

16. Apparatus comprising:
an immersion photolithography tool having a chamber configured for selectively exposing a portion of a photoresist layer above a substrate, the tool having a light source for exposing a field of the photoresist layer;
a sound source positioned to emit a sound into the chamber, such that the sound is reflected from a top surface of the photoresist layer;

a sound detector positioned to receive the reflected sound; and a processor configured to calculate a local thickness of the photoresist layer at a plurality of locations within the field with sufficient precision to determine a local topography within the field, the calculation based on a round trip time of the sound.

17. The apparatus of claim 16, wherein the photolithography tool further comprises a lens, and the processor is configured to generate a focus parameter for focusing the lens, based on the determined topography, and to provide a signal for controlling the lens based on the focus parameter.

18. The apparatus of claim 16, wherein the processor is configured to generate an energy level parameter for the light source, based on the determined topography, and to provide a signal for controlling an energy level of the light source based on the energy level parameter.

19. The apparatus of claim 16, wherein the tool further comprises:

a lens for focusing light on the field; and a water supply for supplying water between the lens and the substrate.

20. The apparatus of claim 16, wherein the sound source and sound detector are both positioned for operating within the chamber for in situ measurement of the local thickness within the same chamber in which the photoresist is exposed.

* * * * *